(12) United States Patent
Lee

(10) Patent No.: US 11,594,695 B2
(45) Date of Patent: Feb. 28, 2023

(54) ORGANIC LIGHT EMITTING DISPLAY DEVICE

(71) Applicant: LG DISPLAY CO., LTD., Seoul (KR)

(72) Inventor: Eun-Hyung Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/503,227

(22) Filed: Jul. 3, 2019

(65) Prior Publication Data

US 2020/0212331 A1    Jul. 2, 2020

(30) Foreign Application Priority Data

Dec. 31, 2018  (KR) .................. 10-2018-0173646

(51) Int. Cl.
*H01L 51/50*   (2006.01)
*H01L 27/32*   (2006.01)

(52) U.S. Cl.
CPC .......... *H01L 51/50* (2013.01); *H01L 27/3206* (2013.01); *H01L 27/3246* (2013.01); *H01L 27/3258* (2013.01); *H01L 2227/32* (2013.01); *H01L 2251/301* (2013.01); *H01L 2251/56* (2013.01)

(58) Field of Classification Search
CPC ............. H01L 27/3246; H01L 27/3258; H01L 51/5253
See application file for complete search history.

(56) References Cited

U.S. PATENT DOCUMENTS

| 2003/0094615 A1* | 5/2003 | Yamazaki ........... H01L 27/3244 257/72 |
| 2003/0127651 A1 | 7/2003 | Murakami |
| 2006/0022587 A1 | 2/2006 | Jeong et al. |
| 2008/0303424 A1* | 12/2008 | Mitsuya .............. H01L 27/3246 313/504 |
| 2011/0272715 A1 | 11/2011 | Kang et al. |
| 2016/0104860 A1 | 4/2016 | Yasukawa et al. |
| 2017/0047385 A1* | 2/2017 | Teng ................... H01L 27/3246 |
| 2018/0286925 A1* | 10/2018 | Kim ....................... H01L 51/525 |

FOREIGN PATENT DOCUMENTS

| CN | 1708194 A | 12/2005 |
| CN | 101296539 A | 10/2008 |
| CN | 104425542 A | 3/2015 |
| CN | 108074953 A | 5/2018 |
| CN | 108538898 A | 9/2018 |
| JP | 2002-98981 A | 4/2002 |

(Continued)

OTHER PUBLICATIONS

Chinese Office Action for Application No. 2019111952580 dated Jan. 11, 2023.

(Continued)

*Primary Examiner* — Raj R Gupta
(74) *Attorney, Agent, or Firm* — Birch, Stewart, Kolasch & Birch, LLP

(57) ABSTRACT

Disclosed is an organic light emitting display device using an ultraviolet (UV) blocking film which addresses outgassing from an organic film provided in the display device in environments, such as a UV reliability test or outdoor use for a long time, and addresses degradation of an organic stack in an organic light emitting diode caused by the outgassing.

21 Claims, 15 Drawing Sheets

(56) References Cited

FOREIGN PATENT DOCUMENTS

| | | | |
|---|---|---|---|
| JP | 2002-280186 | A | 9/2002 |
| JP | 2003-217832 | A | 7/2003 |
| JP | 2004-85769 | A | 3/2004 |
| JP | 2005-150105 | A | 6/2005 |
| JP | 2006-309254 | A | 11/2006 |
| JP | 2006-309957 | A | 11/2006 |
| JP | 2011-171094 | A | 9/2011 |
| JP | 2011-238597 | A | 11/2011 |
| JP | 2012-25099 | A | 2/2012 |
| JP | 2013-114772 | A | 6/2013 |
| JP | 2014-26906 | A | 2/2014 |
| KR | 10-2010-0004221 | A | 1/2010 |
| KR | 10-2018-0035512 | A | 4/2018 |
| KR | 10-2018-0051315 | A | 5/2018 |
| TW | 201407767 | A | 2/2014 |
| WO | WO 2008/066122 | A1 | 6/2008 |
| WO | WO 2017/171460 | A1 | 10/2017 |

OTHER PUBLICATIONS

Japanese Office Action for Application No. 2021-103774 dated Jan. 17, 2023.

\* cited by examiner

ORGANIC LIGHT EMITTING DISPLAY DEVICE

CROSS-REFERENCE TO RELATED APPLICATION

This application claims the benefit of Korean Patent Application No. 10-2018-0173646, filed on Dec. 31, 2018 in the Korean Intellectual Property Office, the disclosure of which is incorporated herein by reference.

BACKGROUND OF THE INVENTION

Field of the Invention

The present invention relates to a display device, and more particularly, to an organic light emitting display device which prevents outgassing from an organic film in the display device in environments, such as a UV reliability test or outdoor use for a long time, and prevents degradation of an organic stack in an organic light emitting diode caused by outgassing.

Discussion of the Related Art

As we have recently entered the information age, the field of displays which visually display electrical information signals has been rapidly developed and, in order to satisfy such development, various flat display devices having excellent performance, such as thinness, light weight and low power consumption, are being developed and rapidly replacing conventional cathode ray tubes (CRTs).

As examples of flat display devices, there are a liquid crystal display (LCD), a plasma display panel (PDP), a field emission display (FED), an organic light emitting diode (OLED), a quantum dot display device, etc.

Thereamong, self-luminous display devices which do not require separate light sources and achieve compactness and clear color display, such as an organic light emitting display device, are considered as competitive applications.

Reliability of display devices is verified through various tests prior to launch of products. Among these tests, considering that display devices are commonly used in outdoor environments, such as an extremely hot environment and an extremely cold environment, a UV reliability test is required recently.

An organic light emitting display device is vulnerable to moisture in terms of characteristics of an organic light emitting layer configured to emit light, and an emission area is reduced by UV light and thus does not normally emit light, thus shortening the lifetime of the organic light emitting display device.

SUMMARY OF THE INVENTION

Accordingly, the present invention is directed to an organic light emitting display device that substantially obviates one or more problems due to limitations and disadvantages of the related art.

An object of the present invention is to provide an organic light emitting display device which has a UV blocking layer provided therein and is thus stable even in environments, such as a UV reliability test or outdoor use for a long time.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, an organic light emitting display device includes thin film transistors provided on a substrate, a planarization film configured to cover the thin film transistors, a first electrode connected to the exposed part of each of the thin film transistors, a bank configured to expose a part of the first electrode to define an emission part, a spacer provided on the bank, an ultraviolet (UV) blocking layer provided on surfaces of the bank and the spacer except for an upper surface of the first electrode corresponding to the emission part, and an organic light emitting layer configured to overlap the emission part and the UV blocking layer around the emission part.

The UV blocking layer can reflect or absorb light of a wavelength of about 10 nm to 400 nm.

The UV blocking layer can be open on an upper surface of the spacer.

The UV blocking layer can be open on a part of a side surface of the spacer connected to the upper surface of the spacer as well as on the upper surface of the spacer.

The organic light emitting display device can further include an auxiliary ultraviolet (UV) blocking layer provided on an upper surface of the planarization film.

The auxiliary UV blocking layer can be provided in a region not provided with the first electrode.

The UV blocking layer can include an inorganic blocking film.

The inorganic blocking film can include at least one selected from the group consisting of $ZnO_x$, $TiO_x$, $Si_xN_y$ and $Ta_xO_y$.

The UV blocking layer can include one or more pairs of an inorganic blocking film and an organic blocking film configured to be alternately stacked.

The inorganic blocking film can include at least one selected from the group consisting of $ZnO_x$, $TiO_x$, $Si_xN_y$ and $Ta_xO_y$, and the organic blocking film can include one selected from the group consisting of polytetrafluoroethylene (PTFE), polyvinylidene fluoride (PVDF), polyethylene terephthalate (PET), cyclo olefin polymer (COP) and polycarbonate (PC).

The UV blocking layer can have a thickness of 700 Å to 2000 Å.

The auxiliary UV blocking layer can include an inorganic blocking film.

The inorganic blocking film of the auxiliary UV blocking layer can include at least one selected from the group consisting of $ZnO_x$, $TiO_x$, $Si_xN_y$ and $Ta_xO_y$.

An organic light emitting display device includes: at least one thin film transistor (TFT) on a substrate; an electrode electrically connected to the at least one TFT; a bank to expose an emission part of the electrode; a dielectric layer on the bank, and to at least one of reflect and absorb light in an ultraviolet range; and an organic light emitting layer to overlap the emission part and on the dielectric layer around the emission part.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
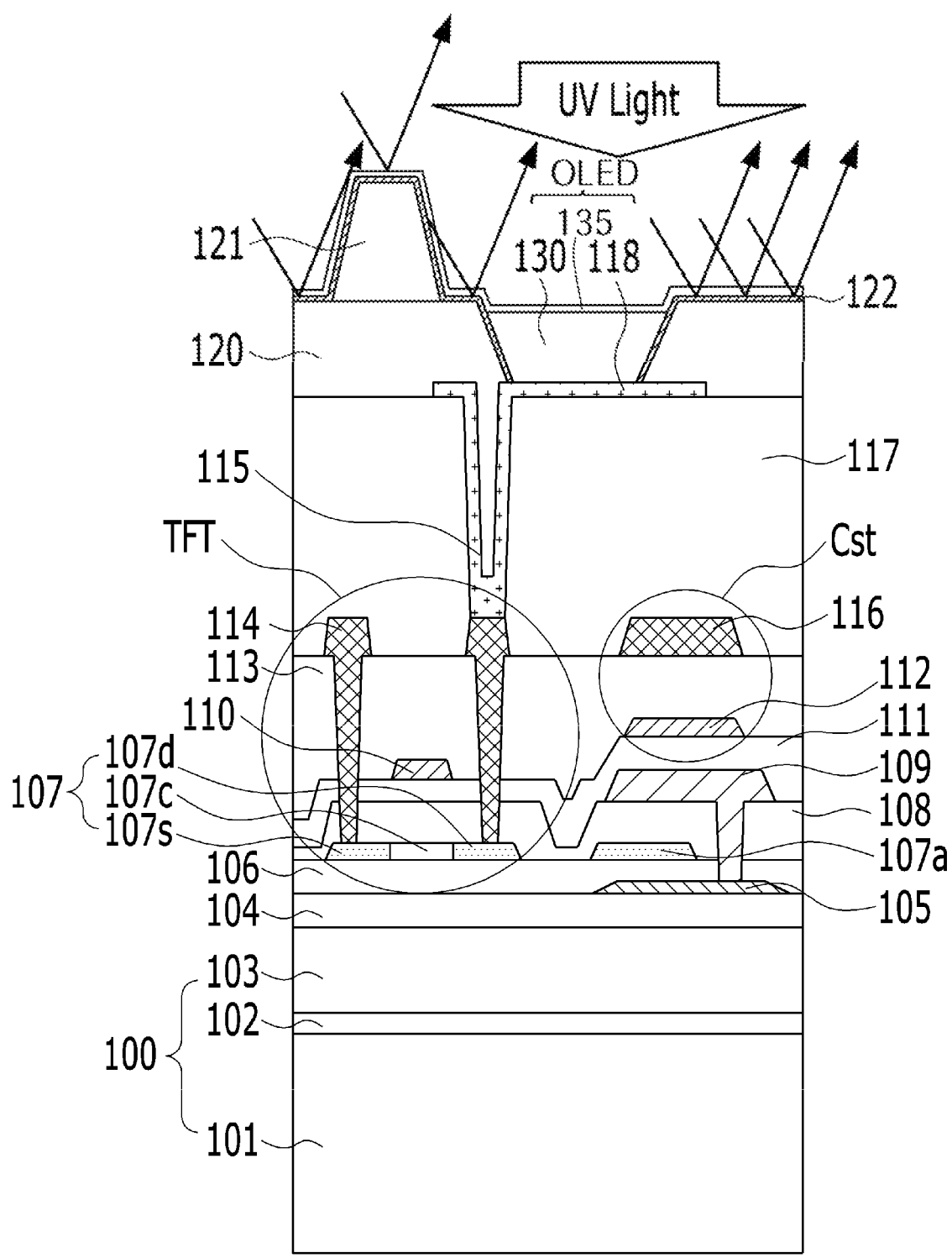
FIG. 1 is a cross-sectional view of an organic light emitting display device in accordance with a first embodiment of the present invention.

Reference will now be made in detail to the preferred embodiments of the present invention, examples of which are illustrated in the accompanying drawings. However, the present invention can be embodied in many alternative forms and should not be construed as limited to the embodiments set forth herein, and the embodiments of the present invention are provided only to completely disclose the invention and to completely inform those skilled in the art of the scope of the invention. Therefore, it should be understood that there is no intent to limit the invention to the particular forms disclosed, but on the contrary, the invention is to cover all modifications, equivalents, and alternatives within the spirit and scope of the invention as defined by the claims.

Shapes, sizes, rates, angles, numbers, etc. disclosed in the drawings to describe the embodiments of the present invention are only exemplary and do not limit the present invention. In the following description of the embodiments and the drawings, the same or similar elements are denoted by the same reference numerals even though they are depicted in different drawings. In the following description of the embodiments of the present invention, a detailed description of known functions and configurations incorporated herein will be omitted when it can make the subject matter of the present invention rather unclear. In the following description of the embodiments, the terms 'including', 'having', 'consisting of', etc. will be interpreted as indicating presence of one or more other characteristics, numbers, steps, operations, elements or parts stated in the specification or combinations thereof, and do not exclude presence of characteristics, numbers, steps, operations, elements, parts or combinations thereof, or possibility of adding the same, unless the term 'only' is used. It will be understood that a singular expression includes a plural expression unless stated otherwise.

In interpretation of elements included in the various embodiments of the present invention, it will be interpreted that the elements include error ranges even if there is no clear statement.

In the following description of the embodiments, it will be understood that, when positional relations are expressed, for example, when an element is 'on', 'above', 'under', 'beside', etc. another element, the two elements can directly contact each other, or one or more other elements can be interposed between the two elements unless the term 'just' or 'directly' is used.

In the following description of the embodiments, it will be understood that, when temporal relations are expressed, for example, a term expressing a sequence of events, such as 'after', 'subsequent to', 'next to' or 'before' can encompass continuous relationship between the events, or discontinuous relationship between the events unless the term 'just' or 'directly' is used.

In the following description of the embodiments, it will be understood that, when the terms 'first', 'second', etc. are used to describe various elements, these terms are used merely to discriminate the same or similar elements. Therefore, an element modified by the term 'first' can be the same as an element modified by the term 'second' within the technical scope of the invention unless stated otherwise.

Characteristics of the various embodiments of the present invention can be partially or entirely connected to or combined with each other and technically variously driven and interlocked with each other, and the various embodiments can be independently implemented or be implemented together in connection with each other.

FIG. 1 is a cross-sectional view of an organic light emitting display device in accordance with a first embodiment of the present invention.

As exemplarily shown in FIG. 1, the organic light emitting display device in accordance with the first embodiment of the present invention includes thin film transistors TFT provided on a substrate, a planarization film 117 covering the thin film transistors TFT except for a part of each thin film transistor, a first electrode 118 connected to the exposed part of the thin film transistor TFT, a bank 120 configured to expose a part of the first electrode 118 to define an emission part, a spacer 121 provided on the bank 120, a UV blocking layer 122 provided on the surfaces of the bank 120 and the spacer 121 except for the upper surface of the first electrode 118 corresponding to the emission part, and an organic light emitting layer 130 overlapping the emission part and the UV blocking layer 122 around the emission part. All the components of the organic light emitting display device according to all embodiments of the present disclosure are operatively coupled and configured.

The substrate 100 can be a glass substrate, a plastic substrate or a metal substrate. Recently, in order to achieve flexibility of the organic light emitting display device, a plastic substrate is preferred. The plastic substrate can be formed of polyimide (PI), polyethylene terephthalate (PET), polyethylene naphthalate (PEN), polycarbonate (PC), polyether sulfone (PES), polyarylate (PAR), polysulfone (PSF), cyclic-olefin copolymer (COC), etc.

FIG. 1 exemplarily illustrates the substrate 100 as including a first base material 103 formed of polyimide having flexibility, and a film formed of plastic, such as polyimide, is generally in danger of being rolled or damaged during an array process, and thus, a sacrificial layer is formed on a glass substrate, the film formed of plastic is deposited thereonto, the array process is completed and then the glass substrate is removed, thereby securing both slimness of the display device and process convenience.

Further, the substrate 100 includes the first base material 103 as a main base material on which an array is formed, and a protective base material 101 can be further adhered to the lower surface of the first base material 103 through an adhesive layer 102 so as to prevent scratches or direct damage to the lower surface of the first base material 103 from the outside. The protective base material 101 can be a plastic film, and be colored as occasion demands.

Hereinafter, a thin film transistor array formed on the substrate 100 will be described. The substrate 100 includes a plurality of pixels arranged in a matrix thereon, and each pixel includes the thin film transistor TFT and a storage capacitor Cst. The illustrated cross-sectional view is a longitudinal-sectional view illustrating the thin film transistor TFT and the storage capacitor Cst, each pixel can further include other thin film transistors TFT and storage capacitors Cst as needed, and the thin film transistor array in the present invention includes elements, such as the thin film transistors, the storage capacitors, etc., and wirings formed in the same layer as these elements.

Prior to formation of the array on the upper surface of the first base material 103, a plurality of buffer layers 104 formed by stacking a plurality of inorganic insulating layers is provided, and the buffer layers 104 prevent impurities from the first base material 103 from being introduced into the array and are in charge of protection of the array. The buffer layers 104 can include an oxide ($SiO_x$) film, a nitride ($SiN_x$) film and an oxynitride ($SiN_xO_y$) film.

A lower light-shielding metal 105 is provided at a designated region on the buffer layers 104.

Thereafter, a semiconductor buffer layer 106 is provided on the lower light-shielding metal 105. The semiconductor buffer layer 106 can be the same kind of organic insulating film as the above-described buffer layers 104.

The semiconductor buffer layer 106 serves to secure flatness of semiconductor layers 107 and 107a formed thereon and to prevent impurities from being transferred to the semiconductor layers 107 and 107a from the layers provided thereunder. As occasion demands, the semiconductor buffer layer 106 prevents hydrogen from being introduced into the semiconductor layers 107 and 107a, thus stabilizing driving characteristics of the thin film transistors including the semiconductor layers 107 and 107a without change in the characteristics thereof.

The semiconductor layers 107 and 107a are formed at designated regions on the semiconductor buffer layer 106. Although the above-described cross-sectional view illustrates a first semiconductor layer 107 and a second semiconductor layer 107a as being separated from each other, the first semiconductor layer 107 and the second semiconductor layer 107a can have a connection part in plan view.

The first semiconductor layer 107 can be used as a semiconductor layer of the thin film transistor TFT, and include an undoped channel region 107c, and a source region 107s and a drain region 107d doped with impurities and arranged at both sides of the channel region 107c. The second semiconductor layer 107a is defined as the same doped region as the source region 107s and the drain region 107d. A doping process of the first semiconductor layer 107 and the second semiconductor layer 107a is performed by patterning the shapes of the first and second semiconductor layers 107 and 107a and doping regions, which are exposed by selectively shielding the channel region 107c, with impurities. The first and second semiconductor layers 107 and 107a can be formed of, for example, at least one selected from the group consisting of amorphous silicon, crystalline silicon and an oxide semiconductor, or be formed by stacking two or more layers formed of the same.

A gate insulating film 108 covering the semiconductor layers 107 and 107a is formed on the semiconductor buffer layer 106.

A connection hole to expose a part of the lower light-shielding metal 105 is formed by selectively removing the gate insulating film 108 and the semiconductor butter layer 106, and a gate electrode 110 overlapping the channel region 10c of the first semiconductor layer 107 and a first connection wiring 109 spaced apart from the gate electrode 110 and stabilizing an electrical signal of the lower light-shielding metal 105 are formed by depositing a metal on the gate insulating film 108 including the connection hole and then selectively removing the deposited metal.

A first interlayer insulating film 111 is provided on the gate insulating film 108 provided with the gate electrode 110 and the first connection wiring 109 formed thereon.

A first storage electrode 112 overlapping the first connection wiring 109 is provided on the first interlayer insulating film 111.

A second interlayer insulating film 113 is provided on the first interlayer insulating film 111 including the first storage electrode 112. Here, the first interlayer insulating film 111 and the second interlayer insulating film 113 can be inorganic insulating films, such as an oxide film, a nitride film, an oxynitride film, etc.

Connection holes to expose both sides of the first semiconductor layer 107, i.e., the source region 107s and the drain region 107d, are formed by selectively removing the second interlayer insulating film 113 and the first interlayer insulating film 111.

A source electrode 114 and a drain electrode 115 connected to the source region 107s and the drain region 107d of the first semiconductor layer 107 through the connection holes, and a second storage electrode 116 located in the same layer as the source electrode 114 and the drain electrode 115 are formed by depositing a metal on the second interlayer insulating film 113 including the connection holes and selectively removing the deposited metal.

Here, the second storage electrode 116 located at a region to form the storage capacitor Cst has electrical connection with the source electrode 114 or the drain electrode 115 at another region or is connected to a data line or a separate wiring formed in the same layer as the source electrode 114 or the drain electrode 115 and thus receives an electrical signal, and the first storage electrode 112 is connected to a separate wiring formed in the same layer as the gate electrode 110 and thus receives an electrical signal, thereby forming the storage capacitor Cst at an overlapping region among the first and second storage electrodes 112 and 116 and the second interlayer insulating film 113 between the first and second storage electrodes 112 and 116.

The above-described configurations of the thin film transistor TFT and the storage capacitor Cst can be changed as needed and, as occasion demands, the first storage electrode 112 can be omitted and the connection wiring 109 provided thereunder can replace the function of the first storage electrode 112.

In order to improve light efficiency on a flat surface when an organic light emitting diode connected to the thin film transistor TFT is formed, a planarization film 117 covering the thin film transistor TFT and the storage capacitor Cst is further provided. The planarization film 117 is an organic film including a photoactive compound (PAC) and has a thickness of 1 μm to 5 μm sufficient to cover the lower elements evenly. The photoactive compound (PAC) can include, for example, diazonaphthoquinone (DNQ) sulfonate, and, since cross-linking occurs therein after photo-curing, DNQ sulfonate can have excellent film quality (i.e., high density) and good flatness.

The planarization film 117 is provided with a connection hole to expose the thin film transistor (TFT), i.e., the drain electrode 115, and a first electrode 118 of the organic light emitting diode (OLED) is connected to the drain electrode 115 through the connection hole.

An area opened by the bank 120 is defined as an emission part and, thus, the bank 120 is referred to as an emission part defining film.

A spacer 121 on the bank 120 is provided to prevent collapse of the bank 120 caused by contact between the bank 120 and a fine metal mask provided with a fine opening, which is used to form an organic light emitting layer 130 in each pixel, due to sagging of the fine metal mask by load thereof, and to prevent direct contact between the bank 120 and the fine metal mask. In this case, the spacer 121 can have a narrow width than the bank 120, and the spacer 121 can be provided in some regions of the bank 120. The bank 120 and the spacer 121 can be simultaneously defined through one process using the same material.

The bank 120 and the spacer 121 are formed of polyamide or polyimide. In various embodiments, the spacer 120 can have various cross sectional shapes other than a rectangular shape. For example, the spacer can have cross sectional shapes such as a semicircular shape, triangular shape, a rhombus shape, an undercut shape, a t-shaped cross section, and others.

The above-described planarization film 117 includes a photoactive compound, and the bank 120 and the spacer 121 include polyamic acid. The planarization film 117, the bank 120 and the spacer 121 include in common a carboxyl group (—COOH) as end groups of the compounds of the respective films and, particularly, when irradiated with UV light, the carboxyl group (—COOH) as end groups of the compounds reacts to UV light and is released as carbon dioxide ($CO_2$) and thereby outgassing can occur in the display device.

In order to prevent such outgassing, the organic light emitting display device in accordance with the present invention includes the UV blocking layer 122 provided on the surfaces of the bank 120 and the spacer 121 so as to block UV light. In embodiments of the present invention, the bank 120 and the spacer 121 can be in direct contact.

The UV blocking layer 122 can reflect or absorb light in a UV light wavelength band of about 10 nm to 400 nm. That is, when UV light is incident upon the UV blocking layer 122, the UV blocking layer 122 can reflect or absorb UV light. Even if the UV blocking layer 122 transmits a part of UV light, a transmission amount of UV light is limited to less than 40%, and thus, outgassing caused by reaction of the bank 120 and the spacer 121 or the layers provided thereunder with UV light can be prevented. The UV blocking layer 122 can be a dielectric layer. The dielectric layer can be an inorganic layer. In embodiments of the present disclosure, the UV blocking layer 122 can be a primarily blocking layer, a primarily an absorbing layer, or both. Also, opposite surfaces of the UV blocking layer 122 can be textured or treated to either enhance or retard light absorption or light reflectance. For example, surfaces of the UV blocking layer 122 can have small indentations or protrusions to enable light absorption or light reflectance. In other embodiments, the light incident surface of the UV blocking layer 122 can have light reflectance but the opposite surface of the UV blocking layer 122 can have light transmittance. In such an instance, the UV blocking layer 122 can be formed on the emission part of the first electrode 118.

The UV blocking layer 122 can have a constant thickness so as to sufficiently and effectively absorb or reflect UV light, and particularly have a thickness of 700 Å to 2000 Å. Further, the UV blocking layer 122 can include an inorganic film (or inorganic blocking film) having an excellent UV blocking property, for example, at least one selected from the group consisting of $ZnO_x$, $TiO_x$, $Si_xN_y$ and $Ta_xO_y$. The reason why the UV blocking layer 122 has a thickness of 700 Å or more is that, if the thickness of the UV blocking layer 122 is less than 700 Å, blocking of UV light by the UV blocking layer 122 is discontinuous in a specific wavelength or the UV blocking layer 122 transmits some parts of UV light. Further, the reason why the UV blocking layer 122 has a thickness of 2000 Å or less is that, if the thickness of the UV blocking layer 122 exceeds 2000 Å, loss of light in a visible light wavelength band can be caused.

The UV blocking layer 122 can include one inorganic blocking film including at least one selected from the group consisting of the above-described materials and having a designated thickness or more so as to effectively reflect and absorb UV light, or include a plurality of inorganic blocking films including at least one selected from the group consisting of the above-described material, which are stacked, so as to effectively block light in a UV light wavelength band.

Further, the UV blocking layer 122 is not provided on the first electrode 118 not overlapping the bank 122, and thus, light loss in such a region can be reduced.

The organic light emitting diode (OLED) is formed by the first electrode 118, the organic, light emitting layer 130 and a second electrode 135. The second electrode 135 is provided integrally so as to cover the entirety of all the pixels on the substrate 100, and is uniformly formed not only on the upper surface of the organic light emitting layer 130 but also on the upper surface of the UV blocking layer 122. The second electrode 135 is a semi-transmissive or transparent electrode and thus transmits light from the organic light emitting layer 130.

Although the organic light emitting layer 130 is illustrated as a single film, a hole transport layer and a hole injection layer can be further provided under the organic light emitting layer 130, and an electron transport layer and an electron injection layer can be further provided on the organic light emitting layer 130. Further, the organic light emitting layer 130 can be arranged as a stack structure including a plurality of organic light emitting layers arranged with a charge generation layer disposed therebetween.

In the organic light emitting display device in accordance with the present invention, the UV blocking layer 122 can be formed in a specific opening through one method of physical vapor deposition (PVD), chemical vapor deposition (CVD) and atomic layer deposition (ALD) after formation of the spacer 121, or a photoresist film is provided only at a non-UV blocking portion, i.e., only on the upper surface of the first electrode 118 not overlapping the bank 120, the UV blocking layer 122 is deposited onto the entirety surface of the organic light emitting display device through one of the above-descried deposition methods and is then lifted off from the portion provided with the photoresist film so as to remain in other regions except for the upper surface of the first electrode 118 not overlapping the bank 120.

The UV blocking layer 122 should have an optically UV light blocking property and thus compactness thereof is important, a pulse-type deposition method can be used to prevent formation of inner pin holes, and when such a method is used, the intensity of plasma power is uniformly adjusted.

The UV blocking layer 122 can restrict effects of UV light of severe test conditions applied in a UV reliability test of the organic light emitting display device after manufacture of the organic light emitting display device has been completed, or UV light caused by exposure to sunlight having a large amount of sunshine in use of the organic light emitting display device. Further, the organic light emitting display device in accordance with the present invention prevents denaturalization of the bank 120 and the spacer 12 or the planarization film 117 provided thereunder by UV light or effects of outgassing of each film, caused by reaction to UV light, on other layers, thus having improved reliability.

Figure 2:
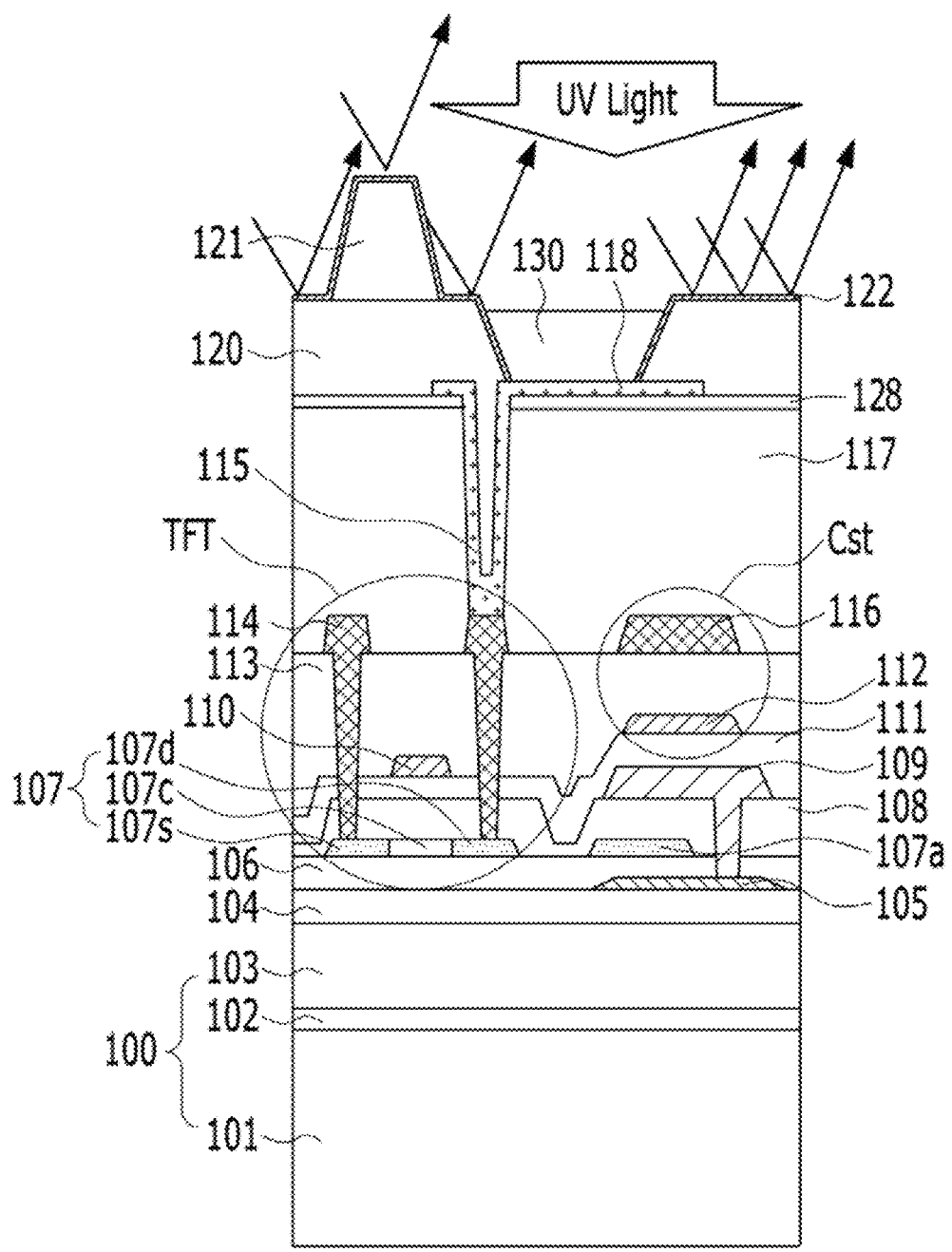
FIG. 2 is a cross-sectional view of an organic light emitting display device in accordance with a second embodiment of the present invention.

FIG. 2 is a cross-sectional view of an organic light emitting display device in accordance with a second embodiment of the present invention.

As exemplarily shown in FIG. 2, the organic light emitting display device in accordance with the second embodiment of the present invention further includes an auxiliary UV blocking layer 128 on the upper surface of the planarization film 117 in addition to the structure of the organic light emitting display device in accordance with the first embodiment. The auxiliary UV blocking layer 128 can include a material of the same series as the material of the above-described UV blocking layer 118, i.e., an inorganic blocking film having an excellent UV blocking property, for example, at least one selected from the group consisting of $ZnO_x$, $TiO_x$, $Si_xN_y$ and $Ta_xO_y$. In case of a top emission type in which the first electrode 118 includes a reflective electrode and the second electrode is a semi-transmissive or transmissive electrode, if the auxiliary UV blocking layer 128 has a thickness of about 700 Å or more so as to have a UV blocking property, the upper limit of the thickness of the auxiliary UV blocking layer 128 can not be restricted. The reason for this is that light is not transmitted to the layer under the first electrode 118 and thus transmission of visible light by the auxiliary UV blocking layer 128 can not be considered.

The auxiliary UV blocking layer 128 is located on the upper surface of the planarization film 117 under the first electrode 118. In this case, the auxiliary UV blocking layer 128 can prevent a part of UV light incident through the upper surface of the first electrode 118 from reacting to components in the planarization film 117 provided under the auxiliary UV blocking layer 128, and the auxiliary UV blocking layer 128 located on the planarization film 117 and under the bank 120 and the spacer 12 can doubly block UV light, thus more stably blocking UV light, as compared to the above-described first embodiment.

Figure 3:
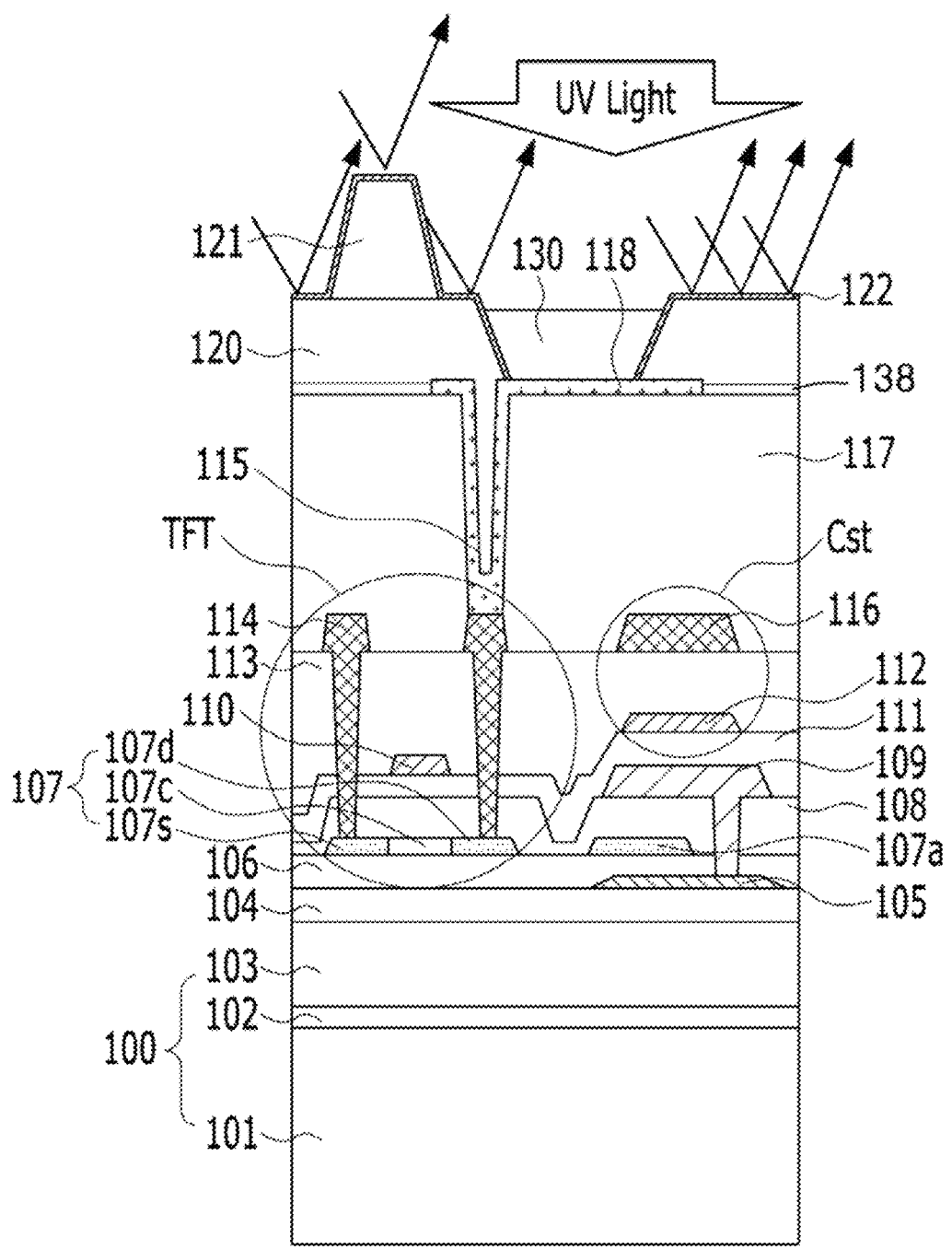
FIG. 3 is a cross-sectional view of an organic light emitting display device in accordance with a third another embodiment of the present invention.

FIG. 3 is a cross-sectional view of an organic light emitting display device in accordance with a third embodiment of the present invention.

As exemplarily shown in FIG. 3, the third embodiment is a modification of the above-described second embodiment of the present invention, and the organic light emitting display device in accordance with the third embodiment of the present invention can further include an auxiliary UV blocking layer 138 in a region only in which the first electrode 118 is not located. Since the first electrode 118 includes a reflective electrode, as described above, the auxiliary UV blocking layer 138 is provided in a region not provided with the first electrode 118 formed at the outside and, thus, the auxiliary UV blocking layer 138 and the first electrode 118 being coplanar with each other prevents UV light from the top from passing through the auxiliary UV blocking layer 138 and the first electrode 118, thereby blocking UV light.

Figure 4:
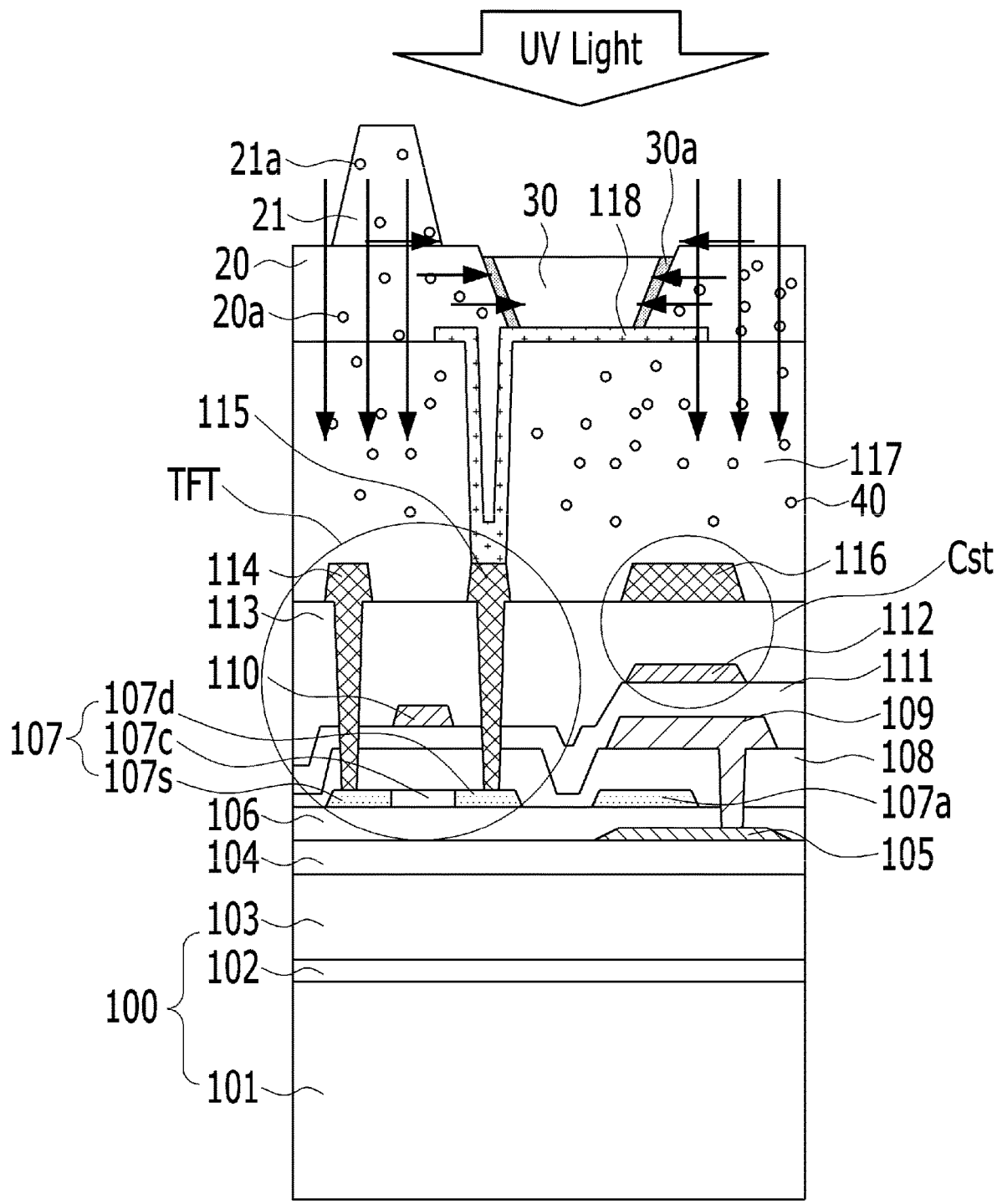
FIG. 4 is a cross-sectional view of an organic light emitting display device in accordance with a comparative example.

FIG. 4 is a cross-sectional view of an organic light emitting display device in accordance with a comparative example.

In contrast to the above-described organic light emitting display devices in accordance with the present invention, the organic light emitting display device in accordance with the comparative example shown in FIG. 4 excludes a UV blocking layer and an auxiliary UV blocking layer, UV light incident from the top is incident upon a spacer 21, a bank 20 and a planarization film 117 in the vertical direction, and thus, outgassing 40, 20a and 21a occurs in the planarization film 117, the bank 20 and the spacer 21. Gases 21a and 20a move through the side parts of the spacer 21 and the bank 20, generate a side degradation part 30a of an organic light emitting layer 30, and can thus cause reduction of an emission area.

Hereinafter, chemical formulas of components of a planarization film, a bank and a spacer and changes in the components in a UV reliability test will be described, and causes of outgassing generated in these films in the UV reliability test will be described.

Figure 5:
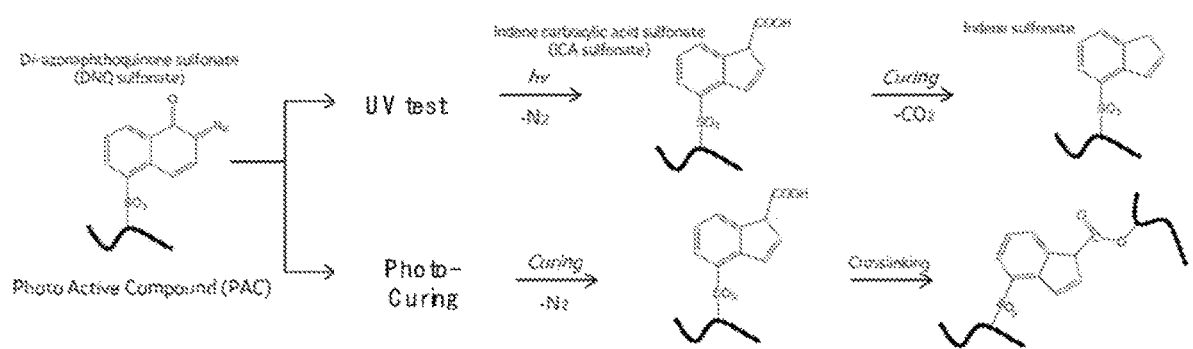
FIG. 5 is a view illustrating chemical reactions according to whether or not bleaching occurs according to UV light irradiation of a planarization film.

FIG. 5 is a view illustrating chemical reactions according to whether or not bleaching occurs according to UV light irradiation of a planarization film.

As exemplarily shown in FIG. 5, the planarization film includes a photoactive compound (PAC), i.e., diazonaphthoquinone (DNQ) sulfonate.

That is, the planarization film is formed by forming a film of diazonaphthoquinone (DNQ) sulfonate on a substrate provided with thin film transistors formed thereon and performing photo-curing of the film.

In photo-curing, nitrogen is removed, an end group of indene carboxylic acid sulfonate of chemical formula 1, i.e., a carboxyl group (—COOH), is dehydrogenated, indene carboxylic acid sulfonate has a carbonyl group (—CO), the carbonyl group (—CO) in a molecule is combined with an adjacent molecule and thus forms cross-linking.

A region of the planarization film in which cross-linking is normally formed has dense connections in a polymer, but, in a region of the planarization film which does not react to curing, carbon dioxide is generated from the carboxyl group (—COOH) serving as an end group of indene carboxylic acid sulfonate of chemical formula 1, i.e., outgassing occurs, according to strong UV light irradiation in a UV reliability test and can thus cause degradation of surrounding layers, particularly, an organic light emitting layer in an organic light emitting diode, and damage to some of cross-linked bonds in indene carboxylic acid sulfonate in the polymer so as to continuously generate outgassing. The planarization film is denaturalized by outgassing, and degradation of the organic light emitting layer from the edge thereof, i.e., blackening of the edge of the organic light emitting layer, is generated by denaturalization of the planarization film. Accordingly, when carbon dioxide is generated to be outgassed, the planarization film degraded to be denaturalized, and the gasses including carbon dioxide or others such as water, oxygen and/or hydrogen negatively affects the emission part and the organic light emitting layer.

[Chemical formula 1]

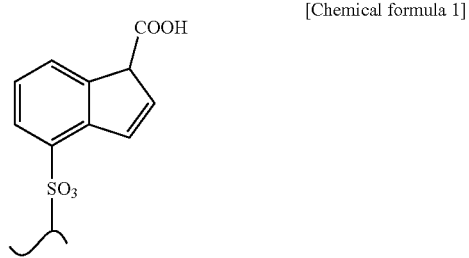

Figure 6:
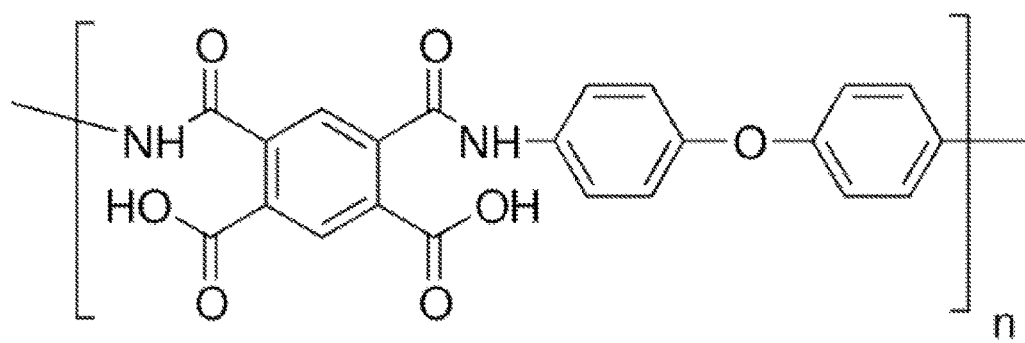
FIG. 6 is a view illustrating a chemical formula of polyamic acid used as a major component of a bank and a spacer.

FIG. 6 is a view illustrating a chemical formula of polyamic acid used as a major component of the bank and the spacer.

As exemplarily shown in FIG. 6, the bank and the spacer are formed of polyamide acquired by polymerizing polyamic acid through curing.

Polyamic acid has a constitution in which there are carboxylic groups (—COOH) disposed symmetrically, and the carboxylic groups (—COOH) in polyamide can be dehydrogenated by strong UV light in a UV reliability test and thus released as carbon dioxide.

Carbon dioxide generated by UV light irradiation moves to an adjacent layer and can thus cause degradation of the organic light emitting layer, in the same manner as the planarization film.

Figure 7:
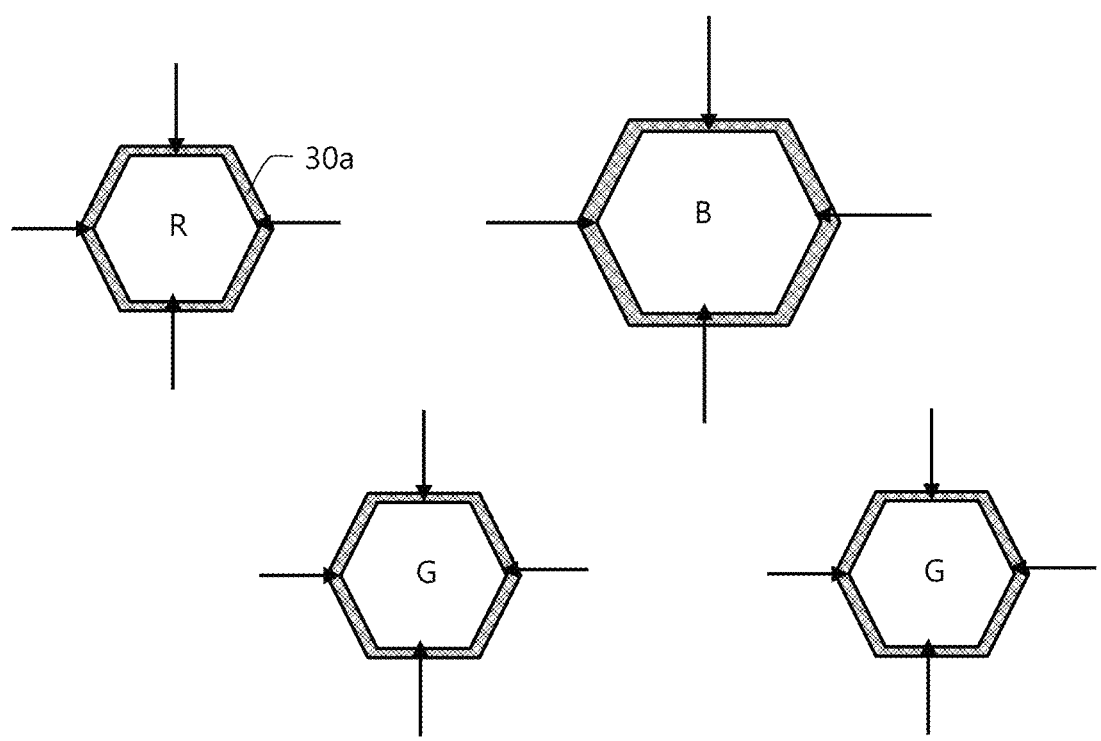
FIG. 7 is a plan view illustrating emission parts which are reduced after a UV reliability test.

FIG. 7 is a plan view illustrating emission parts which are reduced after the UV reliability test.

An emission area defined as an opening of a bank, as exemplarily shown in FIG. 7, is reduced due to generation of the degradation part 30a at the edge of the emission part by influence of outgassing caused by carbon dioxide released from the planarization film or the bank and the spacer after the UV reliability test, as exemplarily shown in FIGS. 4 and 5, and thereby, the lifespan of the organic light emitting display device is shortened.

Further, the electron injection layer provided on the organic light emitting layer includes alkali ions, such as lithium, so as to facilitate injection of electrons from the second electrode, and the moved carbon dioxide and hydrogen provided in the layer react to lithium and form a metal compound, such as $LiHCO_3$, and can thus accelerate the above-described reduction of the emission area.

Hereinafter, other types of the above-described UV blocking layer will be described.

Figure 8:
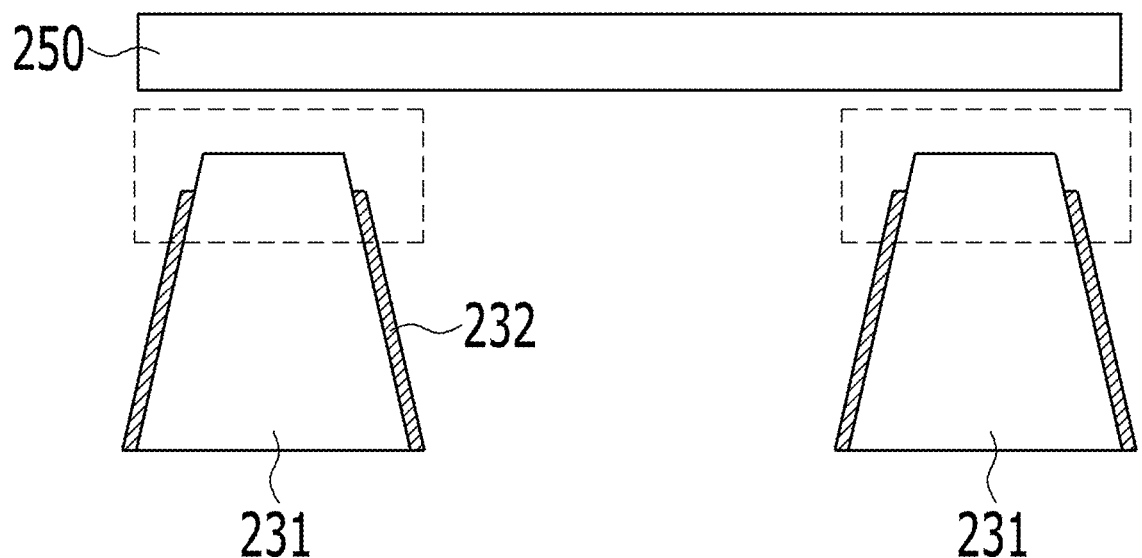
FIG. 8 is a cross-sectional view illustrating a UV blocking layer in accordance with a fourth embodiment of the present invention.

FIG. 8 is a cross-sectional view illustrating a UV blocking layer in accordance with a fourth embodiment of the present invention.

The above-described embodiments exemplarily illustrate the UV blocking layer as including an inorganic blocking film formed of at least one selected from the group consisting of $ZnO_x$, $TiO_x$, $Si_xN_y$ and $Ta_xO_y$.

However, the upper surface of a spacer 231 can contact a fine metal mask 250 when an organic light emitting layer is deposited, and thus, if an inorganic blocking film having hardness is provided on the surface of the spacer 231, cracks can occur in the inorganic blocking film. Further, the cracked inorganic blocking film can remain still in the organic light emitting display device after deposition of the organic light emitting layer, and thus be regarded as a defect.

Therefore, a UV blocking layer 232 in accordance with the fourth embodiment of the present invention is provided to have an opening corresponding to the upper surface of the spacer 231 and a part of the side surface connected to the upper surface, and when the organic light emitting layer is deposited, the upper surface of the spacer 231 having flexibility contacts the fine metal mask 250 and, thus, damage to the UV blocking layer 232 as an inorganic blocking film is prevented. The spacer 231 is formed only on a part of the width of the bank 120 (in FIG. 1) and configured such that the width of the upper portion thereof is smaller than the width of the lower portion thereof, and the opening of the UV blocking layer 232 has a small width which is not sufficient to actually lower the UV blocking function. As occasion demands, the UV blocking layer 232 can be removed only from the upper surface of the spacer 231.

Figure 9:
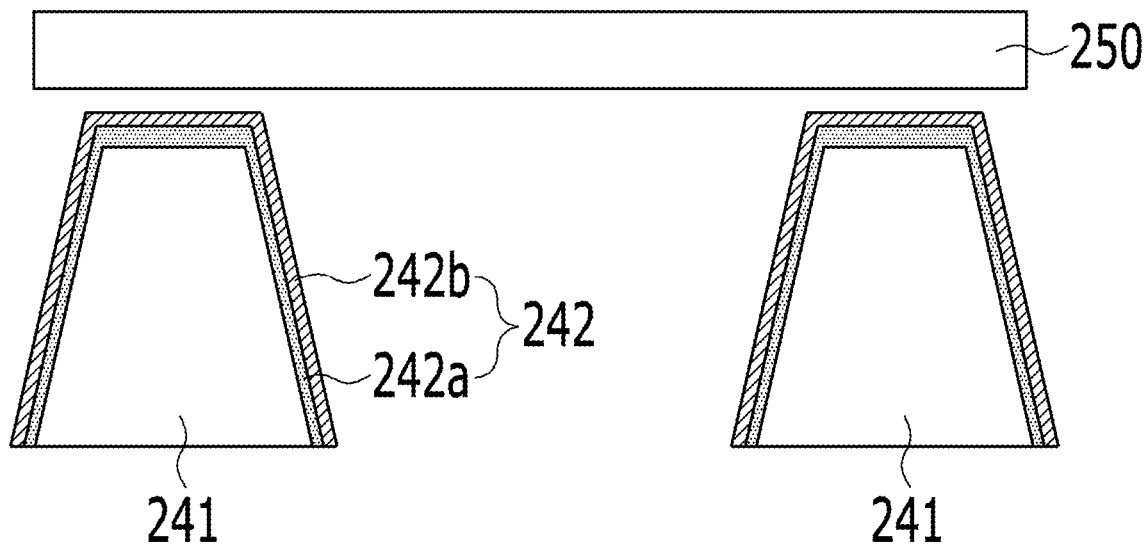
FIG. 9 is a cross-sectional view illustrating a UV blocking layer in accordance with a fifth embodiment of the present invention.

FIG. 9 is a cross-sectional view illustrating a UV blocking layer in accordance with a fifth embodiment of the present invention.

As exemplarily shown in FIG. 9, a UV blocking layer 242 in accordance with the fifth embodiment of the present invention has a double layer structure including a first UV blocking film 242a formed of an inorganic film component and a second UV blocking film 242b formed of an organic film component having elasticity, on a bank 120 (with reference to FIG. 1) and a spacer 241.

In this case, even if the second UV blocking film 242b formed of the organic film component having good elasticity contacts a fine metal mask 250 to form an organic light emitting layer, damage to the second UV blocking film 242b can be prevented.

Here, the first UV blocking film 242a can be an inorganic blocking film including at least one selected from the group consisting of $ZnO_x$, $TiO_x$, $Si_xN_y$ and $Ta_xO_y$, and the second UV blocking film 242b can include one selected from the group consisting of polytetrafluoroethylene (PTFE), polyvinylidene fluoride (PVDF), polyethylene terephthalate (PET), cyclo olefin polymer (COP) and polycarbonate (PC).

In this case, the UV blocking layer 242 can have a constant thickness, and particularly have a thickness of 700 Å to 2000 Å. By providing such a UV blocking layer 242, loss of visible light besides UV light out of external light can be prevented.

Figure 10:
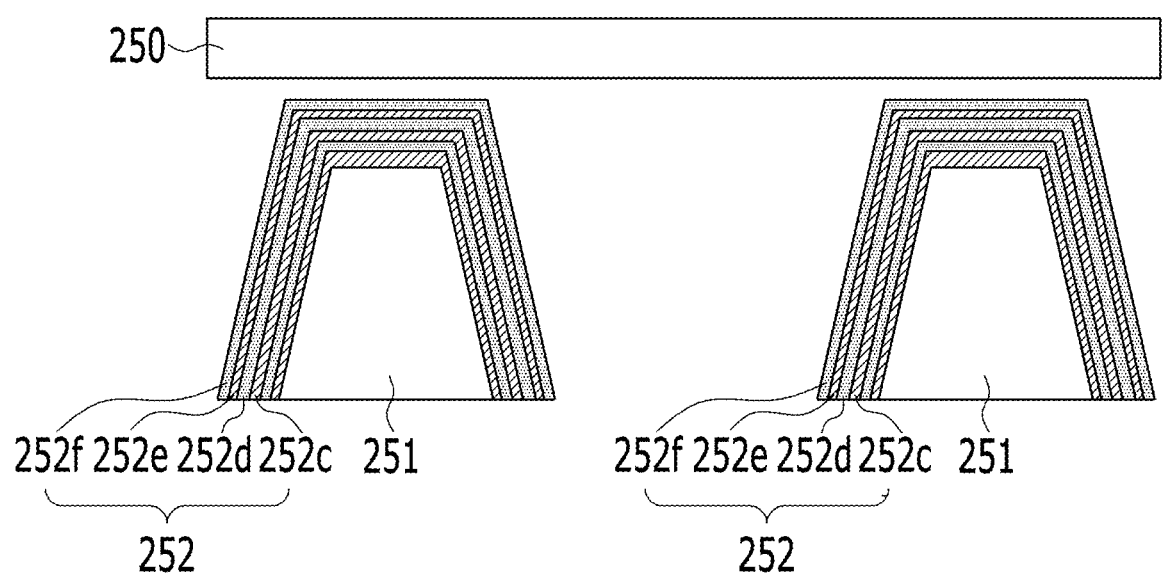
FIG. 10 is a cross-sectional view illustrating a UV blocking layer in accordance with a sixth embodiment of the present invention.

FIG. 10 is a cross-sectional view illustrating a UV blocking layer in accordance with a sixth embodiment of the present invention.

As exemplarily shown in FIG. 10, the sixth embodiment of the present invention is a modification of the above-described fifth embodiment, and a UV blocking layer 252 in accordance with the sixth embodiment of the present invention includes first UV blocking films 252a, 252c and 252e formed of an inorganic film and second UV blocking films 252b, 252d and 252f formed of an organic film, which are alternately stacked in plural pairs. In this case, the uppermost UV blocking film is an organic blocking film, and damage to the UV blocking layer 252 even in contact with a fine metal mask 250 can be prevented.

Figure 11A:
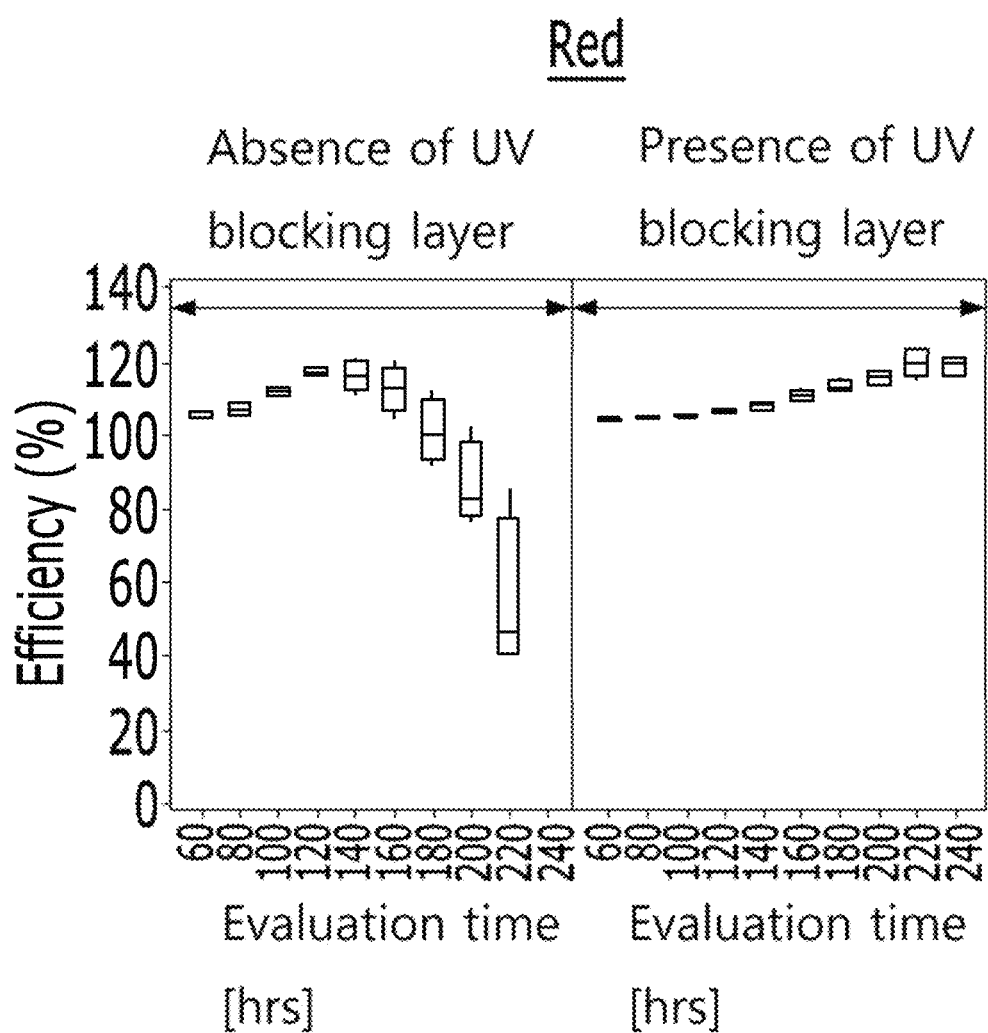
FIGS. 11A to 11C are graphs representing efficiency change in red, green and blue light emitting layers according to presence or absence of a UV blocking layer.
Figure 11B:
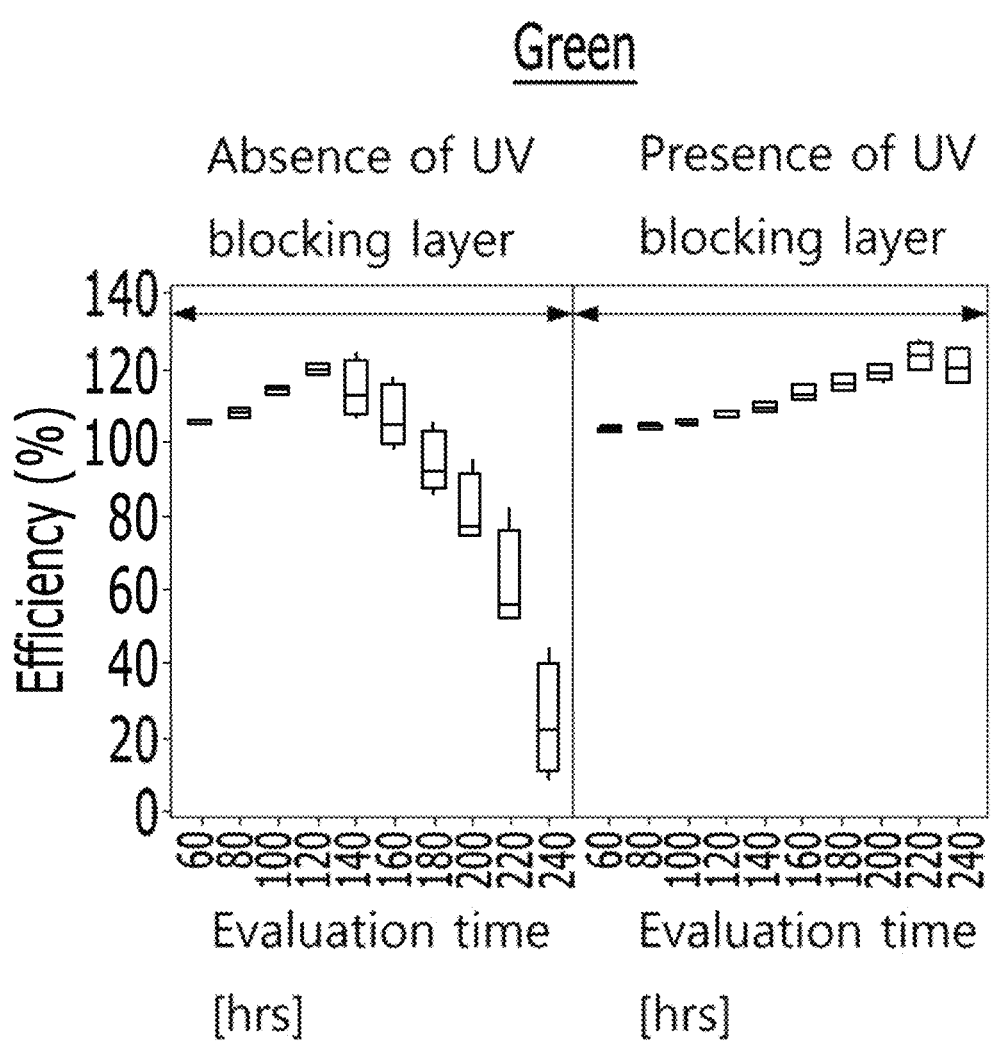
Figure 11C:
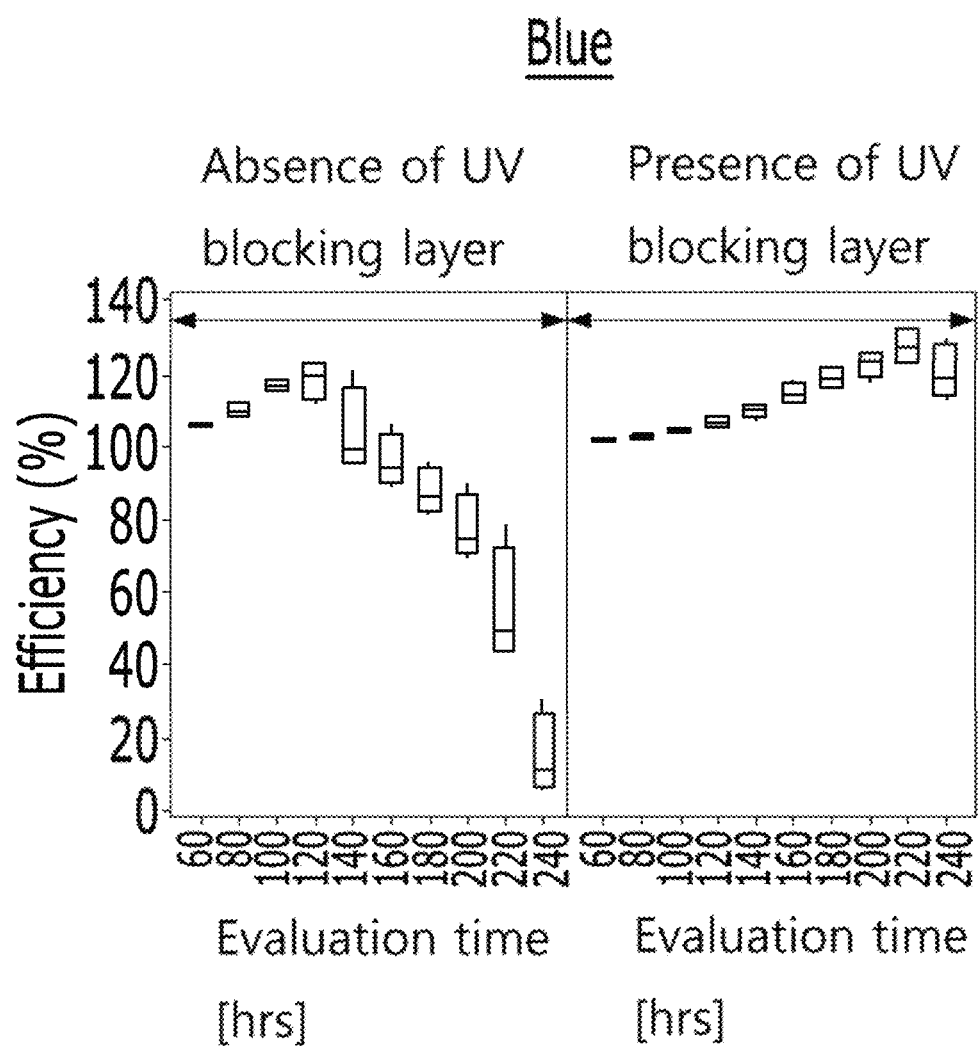

FIGS. 11A to 11C are graphs representing efficiency change in red, green and blue light emitting layers according to presence or absence of a UV blocking layer.

FIG. 11A is a graph representing evaluation of efficiency of red light over time in a UV reliability test according to presence or absence of the UV blocking layer, and, if the UV blocking layer is not provided, efficiency of red light reaches about 10% of efficiency in an initial stage after 240 hours. In contrast, if the UV blocking layer of the present invention is provided, efficiency of red light maintains 100% or more of efficiency in the initial stage even if 240 hours have passed.

FIG. 11B is a graph representing evaluation of efficiency of green light over time in the UV reliability test according to presence or absence of the UV blocking layer, and, if the UV blocking layer is not provided, efficiency of green light reaches about 10% of efficiency in the initial stage after 240 hours. In contrast, if the UV blocking layer of the present invention is provided, efficiency of green light maintains 100% or more of efficiency in the initial stage even if 240 hours have passed.

FIG. 11C is a graph representing evaluation of efficiency of blue light over time in the UV reliability test according to presence or absence of the UV blocking layer, and, if the UV blocking layer is not provided, efficiency of blue light reaches about 10% of efficiency in the initial stage after 240 hours. In contrast, if the UV blocking layer of the present invention is provided, efficiency of blue light maintains 100% or more of efficiency in the initial stage even if 240 hours have passed.

Further, as exemplarily shown in FIGS. 11A to 11C, if the UV blocking layer is provided, efficiencies of red, green and blue light tend to be increased until about 220 hours. It can be confirmed that, even if the UV blocking layer is provided, there is no efficiency reduction under the conditions required in the UV reliability test, and this means that an organic light emitting layer in a product is scarcely denaturalized by UV irradiation.

Figure 12:
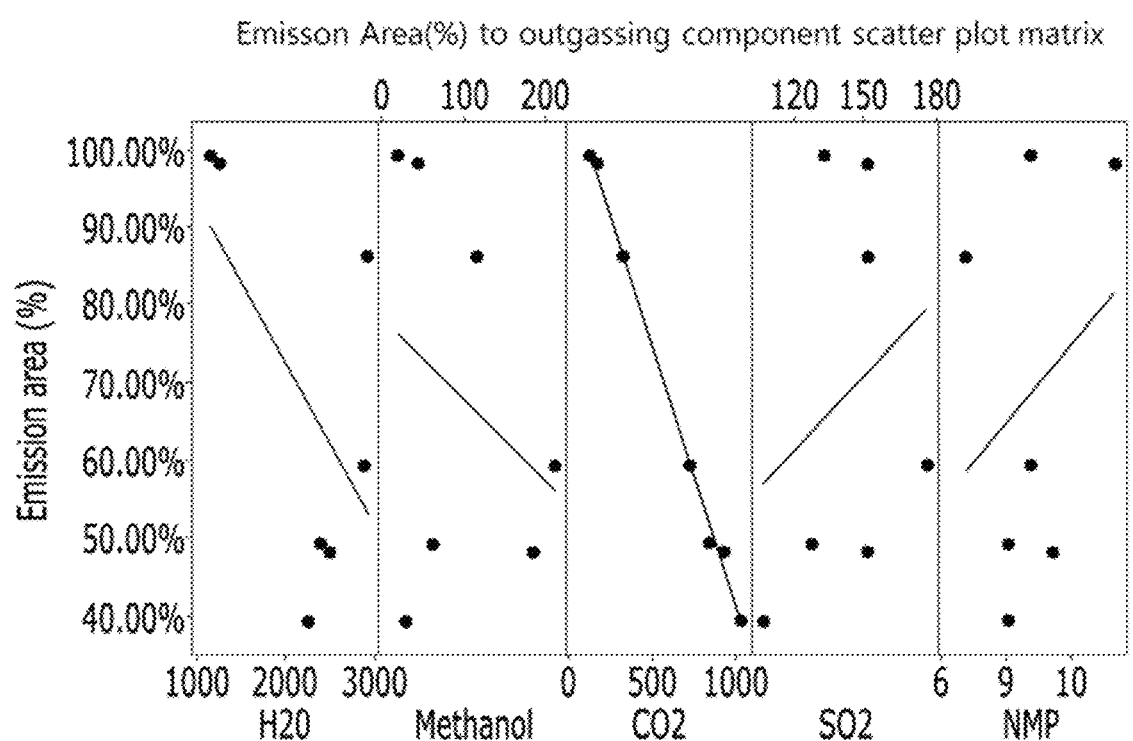
FIG. 12 is a graph representing scatter plot matrices of outgassing in an emission area according to various components.

FIG. 12 is a graph representing scatter plot matrices of outgassing in an emission area according to various components.

The graph of FIG. 12 represents changes in the emission area according to various components, and it can be confirmed that the emission area is remarkably reduced by increase in carbon dioxide. Particularly, this means that, if reduction in the emission area to an amount of carbon dioxide rather than moisture is severer, outgassing of carbon dioxide in a product can cause severe denaturalization in an organic light emitting display device in a UV reliability test.

The organic light emitting display device in accordance with the present invention can include the UV blocking layer so as to prevent such a problem.

Figure 13:
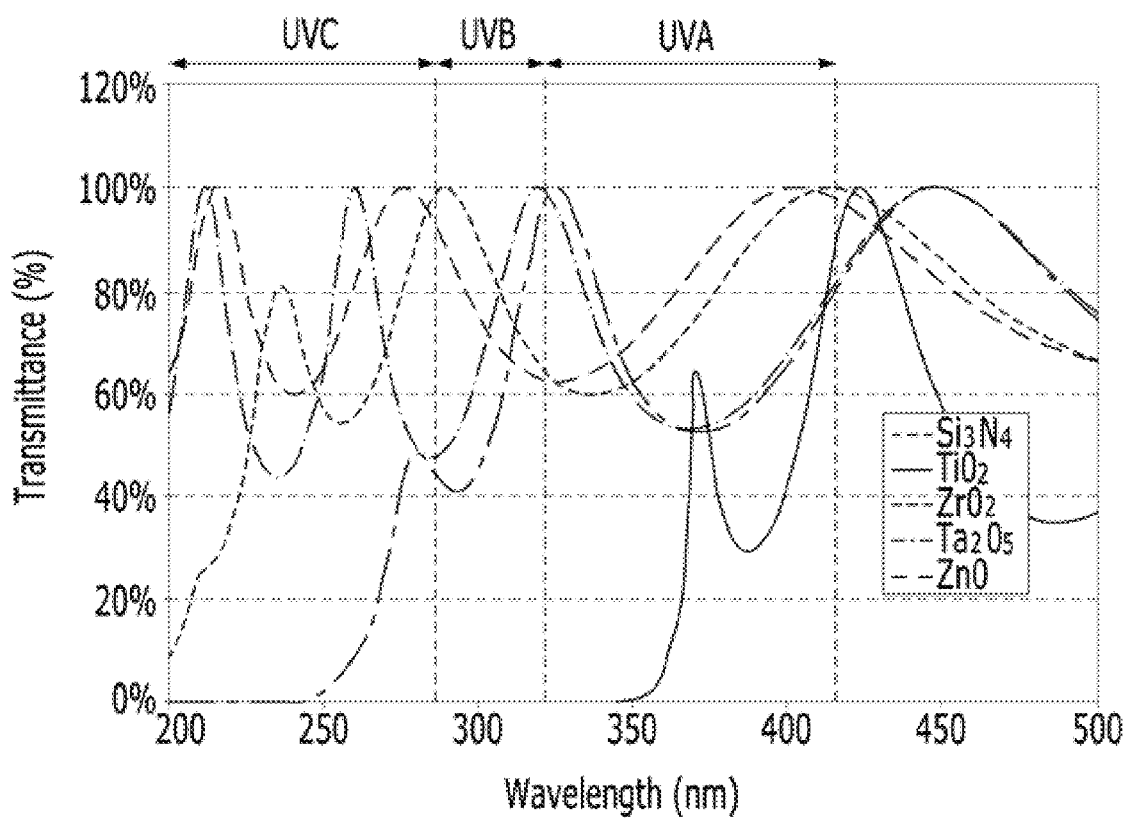
FIG. 13 is a graph representing transmittances of light in a UV light wavelength band in various materials.

FIG. 13 is a graph representing transmittances of light in a UV light wavelength band in various materials.

The graph of FIG. 13 represents transmittances of light of respective wavelengths in products having a thickness of 2000 Å, respectively manufactured using $Si_3N_4$, $TiO_2$, $ZrO_2$, $Ta_2O_5$ and ZnO. $TiO_2$ has the highest blocking property of UV light of a wavelength of 350 nm or less, $Ta_2O_5$ is effective to UV light of a wavelength of about 250 nm or less, and $Si_3N_4$ is effective to UV light of a wavelength of 200 nm or less. Since $ZrO_2$ and ZnO have transmittances of 60% or higher with respect to light in the wavelength range of 200 nm to 400 nm, these materials have difficulty expecting the UV blocking property if they are used alone, and, when these materials are used to provide a UV blocking layer, a plurality of layers formed of materials having higher UV blocking properties can be deposited to increase UV blocking effects.

Figure 14:
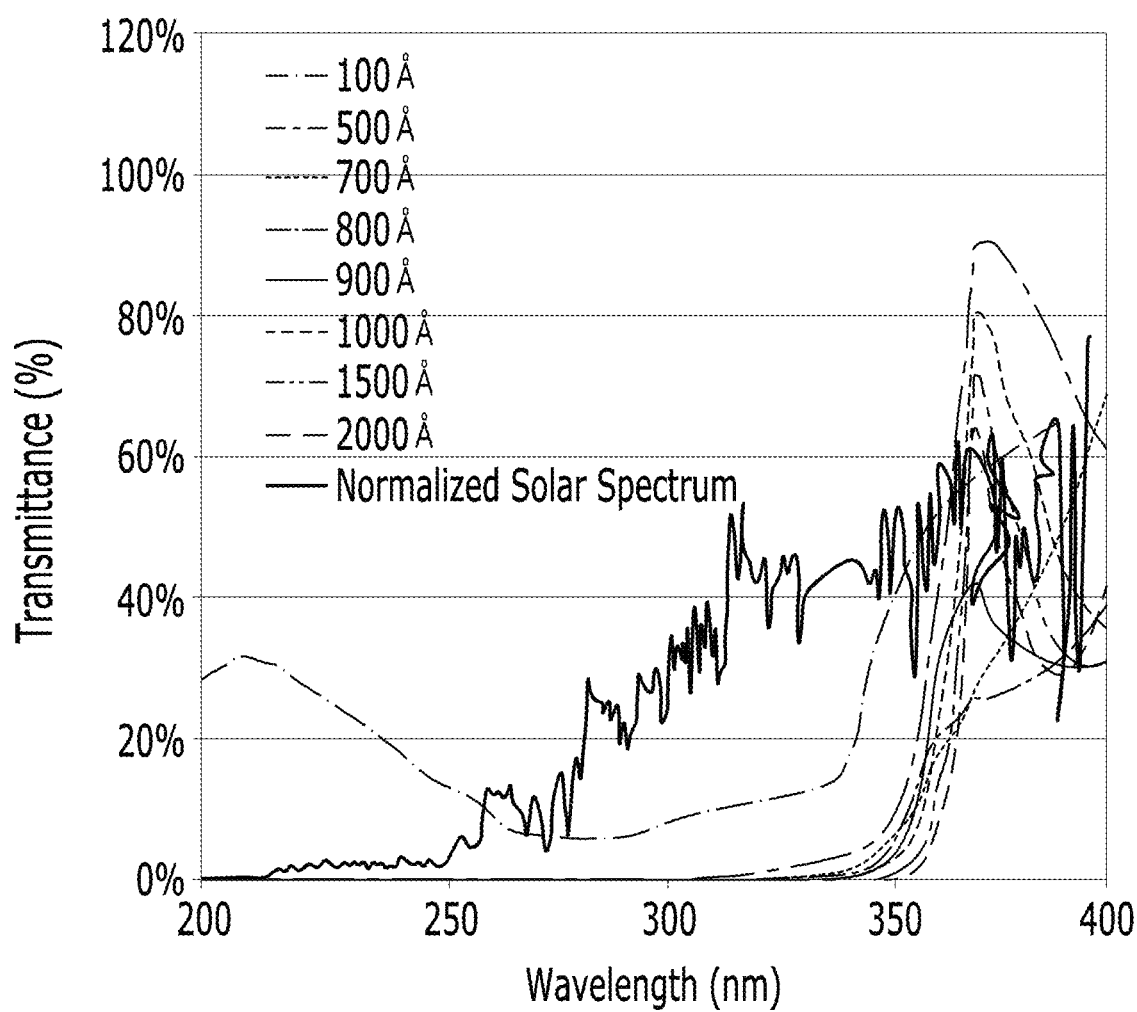
FIG. 14 is a graph representing changes in transmittances of light wavelengths according to thicknesses of $TiO_2$.

FIG. 14 is a graph representing changes in transmittances of light wavelengths according to thicknesses of $TiO_2$.

As exemplarily shown in FIG. 14, when a thin film formed of $TiO_2$ has a thickness of 100 Å, the $TiO_2$ film has a transmittance of 40% or lower with respect to light of a wavelength of about 350 nm or less. It can be confirmed that, when the thickness of the $TiO_2$ film is gradually increased, the transmittance with respect to light of the wavelength of about 350 nm or less is decreased. It can be confirmed that, when the thickness of the $TiO_2$ film is about 500 Å, the $TiO_2$ film has a transmittance of about 5% with respect to light of the wavelength of about 350 nm or less, and, when the thickness of the $TiO_2$ film is about 700 Å or more, the $TiO_2$ film has a lower transmittance with respect to light of the wavelength of about 350 nm or less. That is, when the thickness of the $TiO_2$ film is about 700 Å or more, the $TiO_2$ film scarcely transmit light of the wavelength of about 350 nm or less, and this means that, when the $TiO_2$ film is formed to have a thickness of 700 Å or more, the $TiO_2$ film can stably block UV light.

Figure 15:
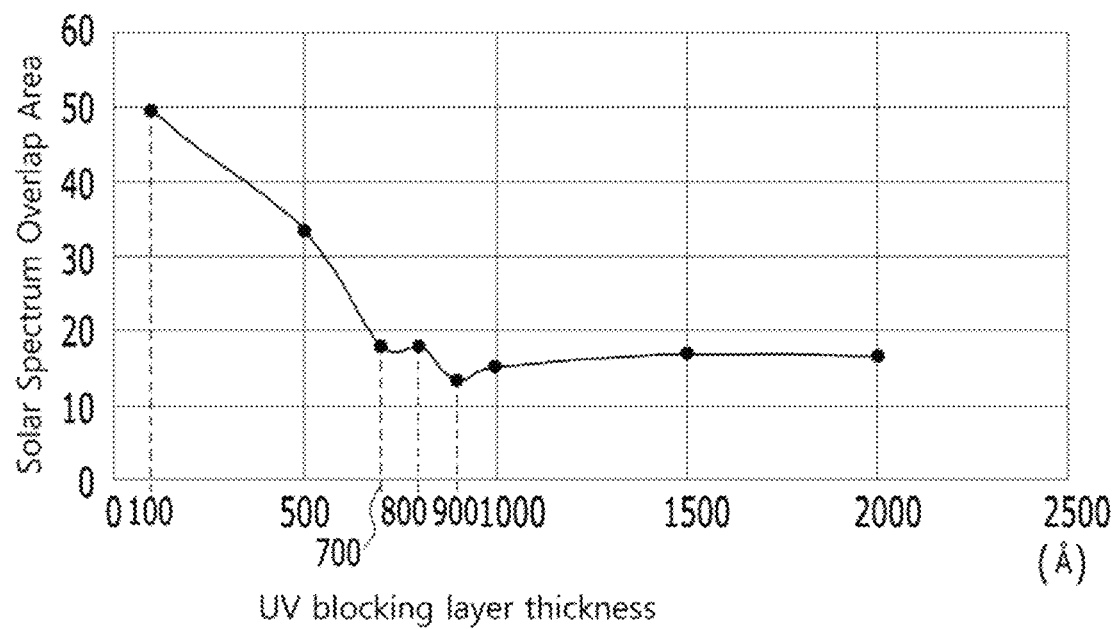
FIG. 15 is a graph representing solar spectrum overlap areas according to thicknesses of the UV blocking layer.

FIG. 15 is a graph representing solar spectrum overlap areas according to thicknesses of the UV blocking layer.

As exemplarily shown in FIG. 15, if the UV blocking layer has a thickness of 700 Å or more, an area of the UV blocking layer overlapping a solar spectrum is 17% or less. This means that, when the thickness of the UV blocking layer is 700 Å or more, the UV blocking layer can sufficiently prevent influence and transmission of light in a UV light wavelength band and prevent layers provided under the UV blocking layer and inner elements from being denaturalized due to reaction to UV light.

Hereinafter, a solar irradiation spectrum will be described in brief. This is one of standards defined to compare efficiencies of optoelectronic devices manufactured by different manufacturers and laboratories. The 1985 Wehrli Standard Extraterrestrial Solar Irradiance Spectrum is used as a standard solar spectrum. Here, in the spectrum, solar energy from 199.50 nm to 10075 nm in increments increasing gradually from 1 nm is measured and defined (unit: $Wm^{-2}nm^{-1}$). In FIG. 15, overlap with the solar spectrum is represented as compared to the measured solar energy solar cell which is regarded as 100%. In the display device of the present invention, overlap with the solar spectrum, i,e., the solar spectrum shown in FIG. 15, represent overlap in a UV light wavelength band, i.e., in wavelength of 200 nm to 450 nm so as to judge influence of a UV light wavelength band.

In consideration of transmittances of $TiO_2$ shown in FIG. 14, when $TiO_2$ implemented as a UV blocking layer, transmitting energy is a value acquired by multiplying energy of the standard solar spectrum to the thickness of the UV blocking layer by transmittance according to thickness.

In his case, even if the $TiO_2$ film has a thickness of 100 Å, the $TiO_2$ film has an overlap area of 50% with the solar spectrum, as compared to the case in that no $TiO_2$ film is provided (having an overlap area of 100% with the solar spectrum), and thus has UV light blocking effects, but, as the thickness $TIO_2$ film is increased up to about 700 Å, an overlap area is gradually decreased with respect to the area of the solar spectrum, if the organic light emitting display device of the present invention includes a UV blocking layer formed of $TiO_2$ and having a thickness of 100 Å, when a thickness deviation of the UV blocking layer due to a recess deviation is about 10%, values of solar spectrum overlap areas in respective regions of the UV blocking layer have irregular deviations and thus the entirety of the UV blocking layer can not acquire a uniform UV light blocking property. Therefore, in the organic light emitting display device of the present invention, the UV blocking layer has a thickness of 700 Å or more, and thus, even if there is a thickness difference between regions of the UV blocking layer due to a process deviation, when the thickness of the UV blocking layer is 700 Å or more, the organic light emitting display device has a solar spectrum overlap area of 17% or less regardless of the thickness thereof, as compared to a structure including no UV blocking layer, and thus has high UV light blocking effects without a UV light blocking property difference due to the process deviation.

The organic light emitting display device of the present invention includes the UV blocking layer on the surface of the bank and the spacer, which have high reactivity to UV light, and thus allows the UV blocking layer to reflect or absorb UV light when the UV light is incident on the organic light emitting display device from the top, thereby preventing the UV light from penetrating into an organic material which causes outgassing when UV light is directly incident on the organic material.

Further, the UV blocking layer blocks transmission of UV light and thus prevents outgassing from layers which are provided under the UV blocking layer and can cause outgassing, thereby preventing reduction in an emission area of the organic stack. Therefore, stability of the organic light emitting diode is maintained and thus a lifespan of the organic light emitting display device is improved.

As occasion demands, another UV blocking layer is formed under the bank and the spacer, and thus prevents influence of UV light, which is incident through some regions not provided with the UV blocking layer even prior to or after formation of the bank and the spacer, on characteristics of elements in the thin film transistor array.

As apparent from the above description, an organic light emitting display device in accordance with the present invention has effects as follows.

First, a UV blocking layer provided in the organic light emitting display device reflects or absorbs UV light when the UV light is incident on the organic light emitting display device, thus preventing the UV light from penetrating into an organic material which causes outgassing when UV light is directly incident on the organic material.

Second, the UV blocking layer blocks transmission of UV light and thus prevents outgassing from layers which are provided under the UV blocking layer and cause outgassing, thereby preventing reduction in an emission area of an organic stack. Therefore, stability of an organic light emitting diode is maintained and thus a lifespan of the organic light emitting display device is improved.

In various embodiments of the present disclosure, the UV blocking layer can be a dielectric layer. In embodiments of the present disclosure, the UV blocking layer can be a primarily blocking layer, a primarily an absorbing layer, or both. Also, opposite surfaces of the UV blocking layer can be textured or treated to either enhance or retard light absorption or light reflectance. For example, surfaces of the UV blocking layer can have small indentations or protrusions to enable light absorption or light reflectance. In other embodiments, the light incident surface of the UV blocking layer can have light reflectance but the opposite surface of the UV blocking layer can have light transmittance. In such an instance, the UV blocking layer can be formed on the emission part of the first electrode.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device comprising:
   thin film transistors on a substrate;
   a planarization film to cover the thin film transistors;
   an electrode connected to each of the thin film transistors;
   a bank to expose a part of the electrode to define an emission part;
   a spacer on the bank;
   an ultraviolet (UV) blocking layer on surfaces of the bank and the spacer except for an upper surface of the electrode corresponding to the emission part, wherein the ultraviolet blocking layer includes an inorganic layer which is in direct contact with the bank and the spacer and has at least one of Ti, Ta, Zr and Zn; and
   an organic light emitting layer on both of the upper surface of the electrode in the emission part and an upper surface of the UV blocking layer around the emission part.

2. The organic light emitting display device according to claim 1, wherein the UV blocking layer has a thickness of 700 Å to 2000 Å.

3. An organic light emitting display device comprising:
   at least one thin film transistor (TFT) on a substrate;
   a first electrode electrically connected to the at least one TFT;
   a bank to expose an emission part of the first electrode;
   a dielectric layer on an upper flat surface and a side surface of the bank, wherein the dielectric layer includes an inorganic layer which is in direct contact with the bank and a spacer and has at least one of Ti, Ta, Zr and Zn;
   an organic light emitting layer to overlap the emission part and on the dielectric layer around the emission part; and
   a second electrode on the dielectric layer and the organic light emitting layer.

4. The organic light emitting display device according to claim 3, wherein an end of the organic light emitting layer is positioned within on the side surface of the bank.

5. The organic light emitting display device according to claim 3, further comprising:
   a planarization film to cover the at least one thin film transistor; and
   the spacer on the bank,
   wherein the dielectric layer is further on the spacer.

6. The organic light emitting display device according to claim 3, wherein the dielectric layer reflects and absorbs light in an ultraviolet range with regard to a light which is incident from an upper surface of the dielectric layer which is not in contact with the upper flat surface and the side surface of the bank and the ultraviolet range is a wavelength of about 10 nm to 400 nm.

7. The organic light emitting display device according to claim 3, wherein the dielectric layer comprises at least one selected from the group consisting of $ZnO_x$, $TiO_x$, and $Ta_xO_y$.

8. The organic light emitting display device according to claim 3, wherein the dielectric layer comprises one or more pairs of an inorganic film and an organic film to be alternately stacked.

9. The organic light emitting display device according to claim 8, wherein:

the inorganic film comprises at least one selected from the group consisting of $ZnO_x$, $TiO_x$, $Si_xN_y$, and $Ta_xO_y$; and the organic film comprises one selected from the group consisting of polytetrafluoroethylene (PTFE), polyvinylidene fluoride (PVDF), polyethylene terephthalate (PET), cyclo olefin polymer (COP) and polycarbonate (PC).

10. The organic light emitting display device according to claim 5, wherein an opening in the dielectric layer exposes an upper flat surface of the spacer.

11. The organic light emitting display device according to claim 10, wherein a contiguous region of a part of a side surface of the spacer and the upper flat surface of the spacer is exposed by the opening in the dielectric layer.

12. The organic light emitting display device according to claim 5, further comprising an auxiliary dielectric layer to at least one of reflect and absorb the light in the ultraviolet range on an upper surface of the planarization film.

13. The organic light emitting display device according to claim 5, further comprising an auxiliary ultraviolet (UV) blocking layer provided in a region not provided with the first electrode.

14. The organic light emitting display device according to claim 5, wherein the spacer and the bank are formed of the same material.

15. The organic light emitting display device according to claim 14, wherein the spacer and the bank are formed of polyamide or polyimide.

16. The organic light emitting display device according to claim 5, wherein the planarization film is an organic film including a photoactive compound (PAC).

17. The organic light emitting display device according to claim 3, wherein the dielectric layer includes first ultraviolet (UV) blocking films and second UV blocking films on the first UV blocking films.

18. The organic light emitting display device according to claim 17, wherein the first UV blocking films are formed of inorganic films and the second UV blocking films are formed of organic films.

19. The organic light emitting display device according to claim 3, wherein the dielectric layer includes a plurality of sub-layers on the inorganic layer having at least one of Ti, Ta, Zr and Zn, and, an outermost sub-layer layer is flexible.

20. The organic light emitting display device according to claim 1, wherein the ultraviolet blocking layer is textured with indentation or protrusion.

21. An organic light emitting display device comprising:
thin film transistors on a substrate;
a planarization film to cover the thin film transistors;
an electrode connected to each of the thin film transistors;
a bank to expose a part of the electrode to define an emission part;
a spacer on the bank;
an ultraviolet blocking layer on surfaces of the bank and the spacer except for an upper surface of the electrode corresponding to the emission part, wherein the ultraviolet blocking layer includes an inorganic layer which is in contact with the bank and the spacer; and
an organic light emitting layer on both of the upper surface of the electrode in the emission part and an upper surface of the UV blocking layer around the emission part,
wherein a contiguous region of a part of a side surface of the spacer and an upper flat surface of the spacer is exposed by an opening in the ultraviolet blocking layer.

* * * * *